United States Patent [19]
Lee et al.

[11] Patent Number: 5,656,091
[45] Date of Patent: Aug. 12, 1997

[54] ELECTRIC ARC VAPOR DEPOSITION APPARATUS AND METHOD

[75] Inventors: Brent Lee, San Jose, Calif.; Youguang Liu, Beijing, China

[73] Assignee: Vacuum Plating Technology Corporation, San Jose, Calif.

[21] Appl. No.: 556,821

[22] Filed: Nov. 2, 1995

[51] Int. Cl.$^6$ .............................. C23C 14/00; C23C 14/32
[52] U.S. Cl. ........................ 118/723 EB; 118/723 VE; 118/726; 204/298.41
[58] Field of Search ........................ 118/726, 715, 118/723 VE, 723 EB; 204/298.41, 192.38; 427/580

[56] References Cited

U.S. PATENT DOCUMENTS

| | | |
|---|---|---|
| 898,346 | 9/1908 | Ferranti . |
| 2,378,476 | 6/1945 | Guellich . |
| 3,294,669 | 12/1966 | Theuerer . |
| 3,369,989 | 2/1968 | Kay et al. . |
| 3,604,970 | 9/1971 | Culbertson et al. . |
| 3,625,848 | 12/1971 | Snaper . |
| 3,678,889 | 7/1972 | Murakami .................. 118/49 |
| 3,691,053 | 9/1972 | James et al. . |
| 3,709,809 | 1/1973 | Wright et al. . |
| 3,736,175 | 5/1973 | Carleton ................. 117/107.1 |
| 3,783,231 | 1/1974 | Sablev et al. . |
| 3,793,179 | 2/1974 | Sablev et al. . |
| 4,094,764 | 6/1978 | Boucher et al. . |
| 4,197,175 | 4/1980 | Moll et al. . |
| 4,222,838 | 9/1980 | Bhagat et al. . |
| 4,333,962 | 6/1982 | Pulker ........................ 427/37 |
| 4,361,114 | 11/1982 | Gurev ........................ 118/723 |
| 4,410,407 | 10/1983 | Macaulay . |
| 4,448,799 | 5/1984 | Bergman et al. . |
| 4,466,872 | 8/1984 | Einbinder . |
| 4,511,593 | 4/1985 | Brandolf ..................... 427/37 |
| 4,511,594 | 4/1985 | Yanai ........................ 427/38 |
| 4,556,471 | 12/1985 | Bergman ..................... 204/298 |
| 4,622,452 | 11/1986 | Bergman et al. . |
| 4,681,773 | 7/1987 | Bean ........................ 427/38 |
| 4,724,058 | 2/1988 | Morrison ................ 204/192.38 |
| 4,801,839 | 1/1989 | Collins ...................... 313/30 |
| 4,828,872 | 5/1989 | Bauer ........................ 427/39 |
| 4,856,457 | 8/1989 | Knauer ...................... 118/666 |
| 4,959,242 | 9/1990 | Itoh ......................... 427/38 |
| 5,100,526 | 3/1992 | Ito ........................ 204/298.05 |

FOREIGN PATENT DOCUMENTS

| | | | |
|---|---|---|---|
| 929892 | 3/1963 | France .................... 118/726 |
| 255553 | 4/1988 | Germany ................... 118/726 |
| 58-110032 | 6/1983 | Japan ..................... 118/726 |
| 58-110031 | 6/1983 | Japan ..................... 118/726 |
| 62-141716 | 6/1987 | Japan ..................... 118/726 |
| 63-18060 | 1/1988 | Japan ................... 204/298.41 |
| 63-76864 | 4/1988 | Japan ..................... 118/726 |
| 3-12390 | 1/1991 | Japan ..................... 118/726 |
| 2202237 | 9/1988 | United Kingdom ........ 204/298.41 |

Primary Examiner—Richard Bueker
Assistant Examiner—Jeffrie R. Lund
Attorney, Agent, or Firm—Robert O. Guillot

[57] ABSTRACT

A present invention relates to improvements in electric arc vapor deposition chambers. A first improvement involves the utilization of a heat shield disposed between a source and a substrate to decrease heat energy radiating from the source directly to the substrate. In a preferred embodiment, the heat shield is cooled by a liquid cooling system which acts to remove heat energy from the chamber. An improved source mounting assembly of the present invention provides for enhanced cooling of the source material. It includes the utilization of a back surface of the source material as a wall of a coolant chamber within the source mounting assembly. An O-ring seal is disposed at the rearward face of the source material to provide a cool temperature environment for the O-ring seal while it prevents coolant leakage into the chamber. An improved method for supplying electrical power for a substrate includes the utilization of a pulsed DC bias voltage which acts to improve the characteristics of a deposited film while avoiding unwanted overheating of the substrate.

5 Claims, 3 Drawing Sheets

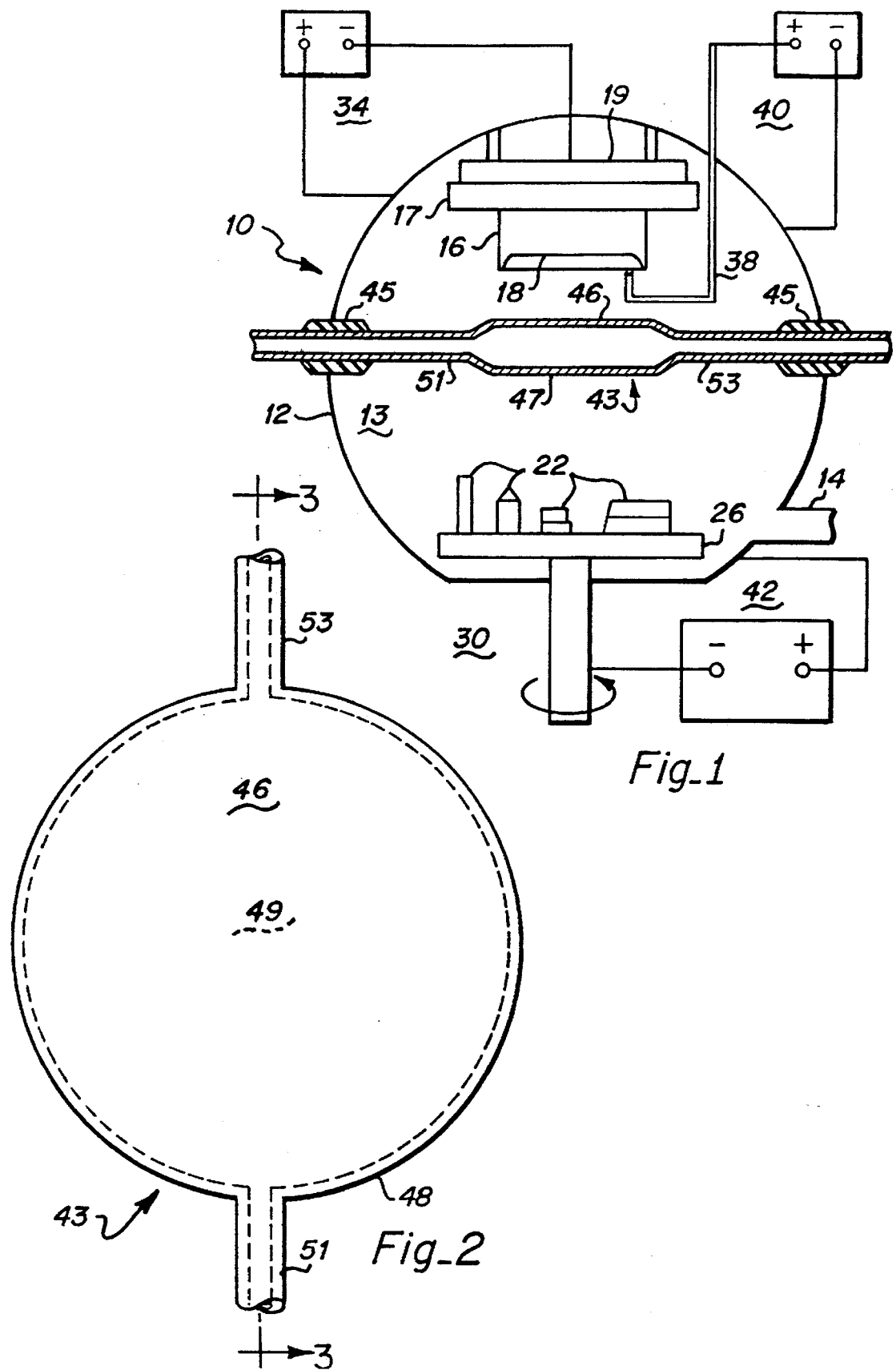
Fig_1
Fig_2

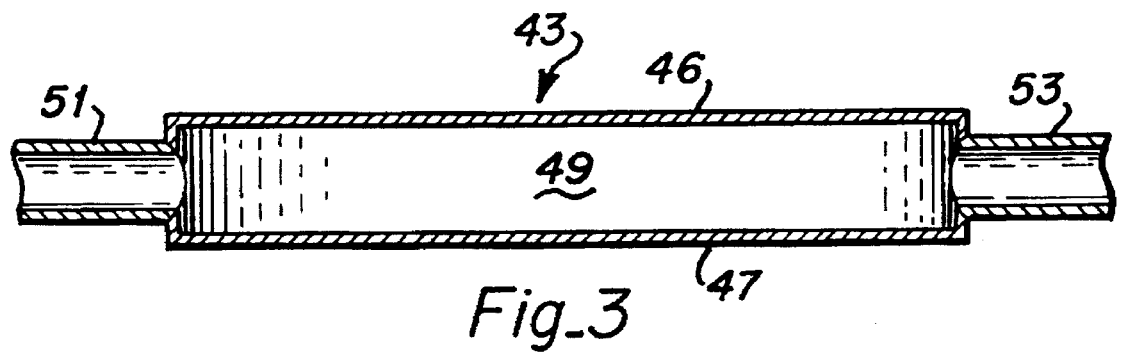
Fig_3
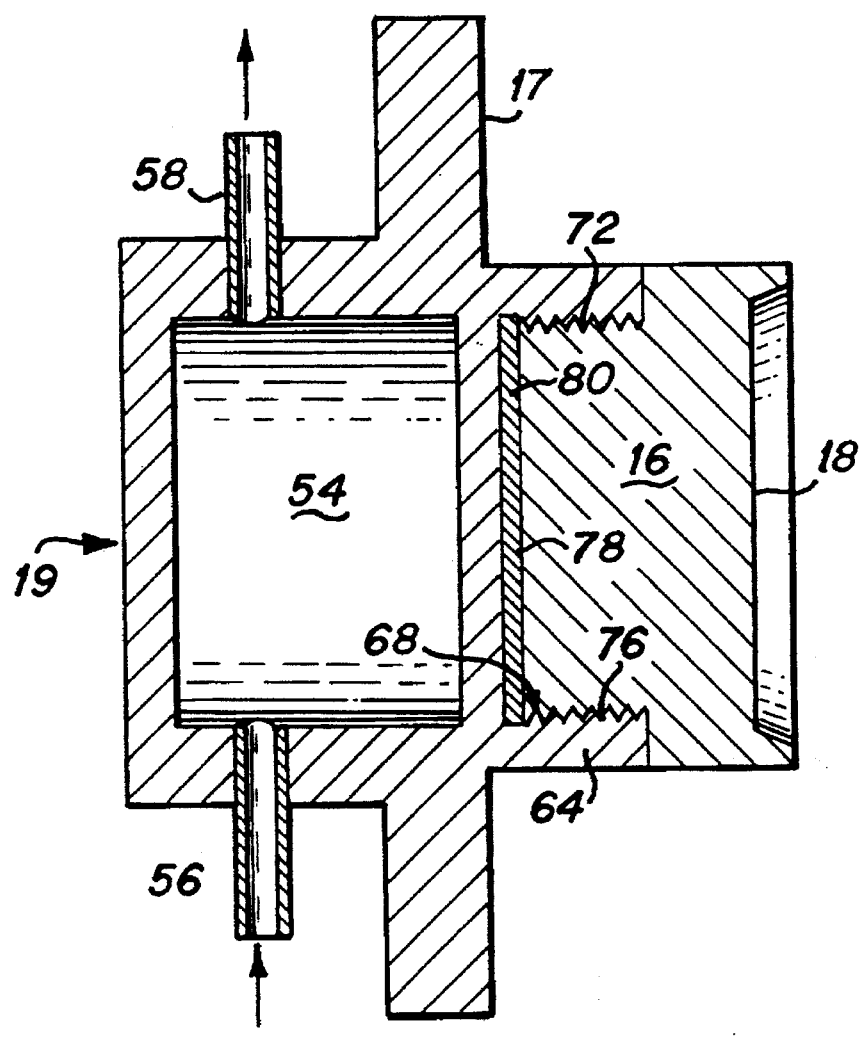
Fig_4

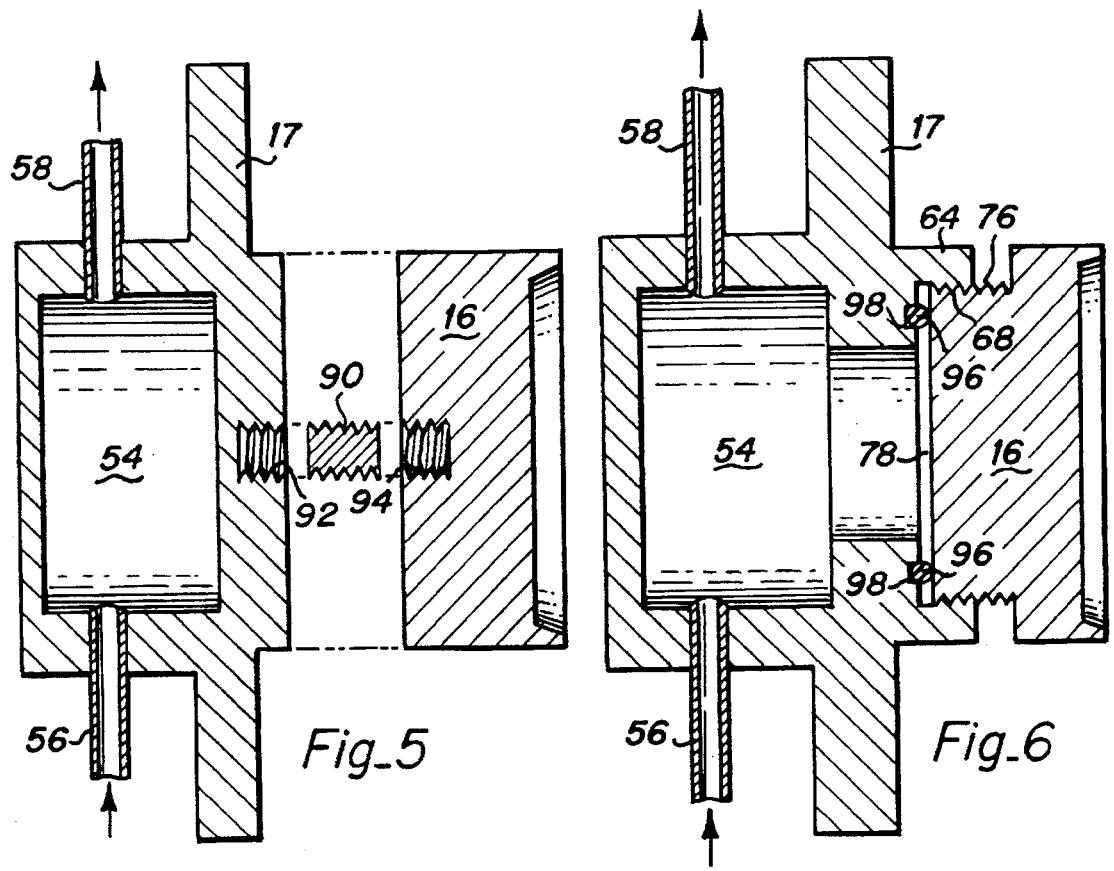
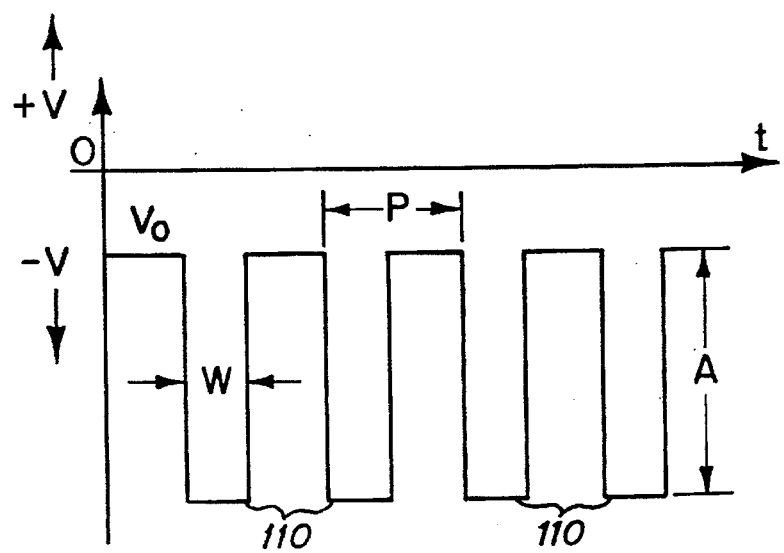

ELECTRIC ARC VAPOR DEPOSITION APPARATUS AND METHOD

BACKGROUND OF THE INVENTION

1. Field of the Invention

The present invention relates generally to devices and methods for depositing layers of material upon substrates, and more particularly to electric arc vacuum deposition devices and methods.

2. Description of the Prior Art

Devices and methods to perform electric arc vapor deposition are known in the prior art, however there are problems with prior art devices which the present invention overcomes.

In U.S. Pat. No. 4,511,593, entitled Vapor Deposition Apparatus and Method, by Henry E. Brandolf, the substrate temperature during the deposition process increases due to direct heat and energized particle radiation from the source or from re-radiation of heat from a line of sight deposition shield. The heat radiated on the substrates causes the substrate temperature to rise, and this high temperature limits the application of this prior art device to only substrates that do not melt or outgas at those prevalent deposition temperatures. Also, in many situations, the deposition films may break away from the substrates due to film layer stress when the substrate temperature is decreased after the deposition process.

In other prior art devices, the sources may require significant cooling. U.S. Pat. No. 4,622,452, entitled Electric Arc Vapor Deposition Electrode Apparatus, by Bergman, et al., improves this source cooling problem somewhat by making the source itself form a wall of the cooling chamber and mounting the source to the cathode assembly by a central stud. A drawback of the Bergman invention is that if the source is not securely and uniformly tightened to cathode body to form a water tight engagement with a peripheral seal, water or water vapor will leak into the vacuum chamber, and any water leakage into the chamber is detrimental to the chamber vacuum and the deposition process. Also, with some prior devices, the film that is deposited on the substrate is generally sparse and characterized by columnar crystal growth that is separated by voids. This means that the film is not a good barrier against the diffusion of solids, liquids and gases through the film.

SUMMARY OF THE INVENTION

A present invention relates to improvements in electric arc vapor deposition chambers. A first improvement involves the utilization of a heat shield disposed between a source and a substrate to decrease heat energy radiating from the source directly to the substrate. In a preferred embodiment, the heat shield is cooled by a liquid cooling system which acts to remove heat energy from the chamber. An improved source mounting assembly of the present invention provides for enhanced cooling of the source material. It includes the utilization of a back surface of the source material as a wall of a coolant chamber within the source mounting assembly. An O-ring seal is disposed at the rearward face of the source material to provide a cool temperature environment for the O-ring seal while it prevents coolant leakage into the chamber. An improved method for supplying electrical power for a substrate includes the utilization of a pulsed DC bias voltage which acts to improve the characteristics of a deposited film while avoiding unwanted overheating of the substrate.

It is an advantage of the present invention that a film can be deposited with excellent bonding on substrates that are made of low melting point materials such as plastics, and high equilibrium vapor pressure materials, using the electric arc vapor deposition method.

It is another advantage of the present invention that it is possible to deposit amorphous films on a substrate at room temperature.

It is an advantage of the method of mounting the source of the present inventions that the problems of coolant leakage from the cathode assembly into the vacuum chamber are substantially reduced.

It is an advantage of the present invention that the method of depositing a film will provide a smoother, denser surface with better bonding and adhesion to a substrate.

It is an advantage of the present invention that the method of depositing a film uses a negative dc voltage bias on the substrate and a cluster of bias voltage pulses for providing a smoother, denser thin film with better bonding and adhesion to the substrates.

IN THE DRAWINGS

FIG. 1 is a diagrammatic representation of an electric arc vapor deposition chamber of the present invention, depicting the basic components thereof;

FIG. 2 is a top plan view of a liquid cooled heat shield of the present invention;

FIG. 3 is a cross sectional view of the heat shield of FIG. 2, taken along lines 3—3 of FIG. 2;

FIG. 4 depicts a first source mounting configuration of the present invention;

FIG. 5 depicts another source mounting configuration of the present invention;

FIG. 6 depicts a further source mounting configuration of the present invention; and FIGS. 7 depicts the substrate bias voltage profile of the present invention.

DESCRIPTION OF THE PREFERRED EMBODIMENTS

The present invention provides an electric arc vapor deposition apparatus and method for depositing coatings on substrates within an evacuation chamber. Coatings are deposited in layers of atomic and molecular thickness, in a manner that maintains the surface integrity and profilometer measurements of the substrate prior to the deposition coating process. The deposition process can be applied to substrates made of a wide variety of conductors, semiconductors, and insulators. A particular application of the present invention is on low melting point materials and materials with a high equilibrium vapor pressure. The coatings provided by the present invention are densely packed so as to serve as an effective diffusion barrier for solids, liquids, and gases. The apparatus requires less adjustment and repairs than prior art devices, and permits easy source material changeover.

A first embodiment 10 of the present invention is depicted in FIG. 1. It includes a vapor deposition apparatus having an evacuation chamber wall 12 which defines a deposition chamber 13 suitable for evacuation. The chamber is evacuated through vacuum port 14 down to any suitable pressure level, typically to below $5 \times 10^{-5}$ Torr. A source 16 is placed in the evacuation chamber 13 in engagement with a cathode mounting portion 17 of a cathode assembly 19. The position of the source material 16 can be anywhere within the chamber 13, such that the attitude of the evaporative surface plane 18 of the source material 16 within the chamber 13 can have three degrees of freedom in the horizontal, vertical and longitudinal axes. One or more substrates 22 (four being depicted) having at least one surface area to be coated are placed inside the evacuation chamber 13. The substrates 22 are supported and fixed within the evacuation chamber 13 by means of a substrate holder 26 that can be a table or other means such as a racking arrangement with bottom supported spindles or top supported spindles, as is well known in the art. The substrate holder 26 can typically provide movement such as rotation 30 and translation in all degrees of freedom to provide uniform substrate deposition coverage.

An arc power supply 34 is connected to the source material and grounded to the chamber wall. A stationary arc ignition trigger electrode rod 38 is positioned near the evaporation source 16, and an ignition power supply 40 is connected to the trigger electrode rod 38 and grounded to the chamber wall. A substrate bias power supply 42 is connected to the substrate and grounded to the chamber wall to provide a substrate bias voltage.

As depicted in FIG. 1, a heat shield 43, that may be constructed of electrically conductive or non-conductive material, is placed in front of the source 16 to provide shielding of the substrate(s) 22 from the heat generated from the source 16 by the arc. The heat shield 43 is held in place by a support structure, which may simply be the coolant flow tubing 51 and 53, and electrically non-conductive mounts 45 are used to engage the heat shield structure to the chamber wall 12. The heat shield 43 is electrically isolated from the chamber wall 12 (ground potential) by using the non-conductive mounts 45 so as to have a floating voltage.

A detailed depiction of the liquid cooled heat shield of the present invention is depicted in FIGS. 2 and 3, wherein FIG. 2 is a top plan view and FIG. 3 is a side cross-sectional view taken along lines 3—3 of FIG. 2. As depicted in FIGS. 2 and 3, the heat shield 43 is a hollow, disk-shaped member having a top surface 46, a bottom surface 47 and a curved side wall 48 which engages the edges of the top surface 46 and the bottom surface 47 to form a liquid holding chamber 49. An inlet tube 51 and an outlet tube 53 are fixedly engaged to the side wall 48, such that liquid from the inlet tube 51 will circulate through the chamber 49 to remove heat energy from the top and bottom surfaces 46 and 47 respectfully, and exit through the outlet tube 53. The heat shield with water cooling is utilized to reduce heat radiating from the heat shield to the substrate to decrease the temperature of the substrate, and as a positive measure to eliminate the heat energy accumulation in the deposition chamber. Thus materials with a low melting point or high equilibrium vapor pressure may be used as substrates in the present invention.

FIG. 4 depicts a first preferred source mounting method, wherein the source 16 is mounted to a cathode assembly 19. The cathode assembly 19 has a sealed water cooling chamber 54 with coolant inlet and outlet passages 56 and 58 respectively for a coolant such as water to enter 56 and exit 58 the chamber 54. The cathode mount portion 17 of the cathode assembly 19 has a cup shaped lip 64 with internal threads 68. The posterior end 72 of the source 16 has a male thread 76 which provides a threadable mounting of the source 16 to the cathode assembly 19. The threaded mount provides for the quick, easy removal and installation of a source 16, without the risk of water leakage into the chamber 13 during and after replacement of the source 16. The end surface 78 of the source 16 is flat to provide a large surface interface with the cathode mount 17 to promote heat transfer cooling. A thin disk 80 composed of a soft metal, such as Indium, may be placed behind the surface 78 to aid in heat transfer between the source 16 and the cathode mount 17. When the source 16 is securely fastened to the cathode assembly 19, the cooling water entering and exiting the cooling chamber 54 will provide adequate cooling for the source 16 for many applications.

As depicted in FIG. 5 source 16 can be mounted to the cathode 17 by means of a threaded stud 90. In this engagement method the center of the cathode 17 has a female threaded hole 92 and the rear center of the source 16 has a female threaded hole 94. The source 16 is mounted to the cathode 17 with the threaded stud 90 that engages the female threads of both the source hole 94 and the cathode hole 92.

An alternative source mounting configuration having enhanced source cooling properties is depicted in FIG. 6, wherein components previously identified are identically numbered. As depicted therein, the water cooling chamber 54 includes inlet passage 56 and outlet passage 58. The cathode mount 17 includes a cup shaped lip 64 having internal threads 68, and the source 16 has male threads 76 which threadably engage the female threads 68. The cooling chamber coolant interacts directly with the rear surface 78 of the source 16 to provide the maximum possible cooling effect. To prevent coolant leakage through the threaded engagement, an O-ring seal 96 is disposed within a seal groove 98 in direct contact with the rear surface 78 of the source 16. When the source 16 is fully threadably engaged within the cathode mount 17 the seal 96 prevents coolant leakage into the chamber. The internal disposition of the seal 96 in close proximity to the cooling chamber 54 permits the seal 96 to remain relatively cool, thereby extending the lifetime and enhancing the properties of the seal 96.

In the preferred embodiment, the substrate(s) 22 are electrically powered by a pulsed DC bias voltage, as shown in FIG. 7. To achieve this, a power supply 42 with the ability to generate a negative DC bias voltage with short pulses 110 of high voltage is electrically connected between the substrate holder 26 and the chamber wall 12. The peak voltage of each pulse 110 is of sufficient amplitude A, preferably over 1,000 volts, to generate sufficient kinetic energy to the ionized source molecules within the chamber 13 that they will collide with high energy with the substrate surface 22 or with layers of film already deposited on substrate 22. The high energy collisions provide better bonding of the molecules forming the film to substrate 22, and cause the film to be deposited in a more densely packed manner. As depicted in FIG. 7, the width W of the pulses 110 is made small enough to prevent significant current flow at peak voltage, thereby substantially eliminating arc formation on the surface of the substrate 22. In this manner, the total RMS power applied to the substrate 22 is low, and this prevents overheating of the substrate as well as etching of substrate surface. In the preferred embodiment the DC bias voltage has a valve of approximately 0 to approximately 500 volts with a preferred value of 50 volts; the pulse width W is in a range from approximately 5 to approximately 100 microseconds with a preferred value of 10 microseconds. The pulse amplitude A is adjustable typically from approximately 100 volts to approximately 2,000 volts with a preferred value of 2,000 volts. The pulse period P is in a range from approximately 10 to approximately 500 microseconds with a preferred value of 100 microseconds, such that the duty cycle of the pulse is adjustable typically from 5% to 50%. The duty cycle is represented by the equation:

$$\text{duty cycle} = [W \times 100/P]\%.$$

The special bias of the substrates improves the properties of the films deposited on the substrates.

While the present invention has been shown and described with reference to certain preferred embodiments, it will be understood by those skilled in the art that various alterations and modifications in form and in detail may be made therein without departing from the invention. Accordingly, it is intended that the following claims cover all such alterations and modifications as fall within the true spirit and scope of the invention.

What we claim is:

1. An electric arc vapor deposition apparatus comprising:

a chamber being defined by chamber walls, said chamber being adapted for use in an electric arc vapor deposition process;

a source being mounted within said chamber for providing material to be vaporized and deposited on a substrate;

a source mounting structure being engaged within said chamber for holding said source;

an electrode rod being disposed within said chamber for providing an electric arc between said rod and said source to vaporize portions of said source;

a substrate holder being disposed within said chamber for holding one or more substrates within said chamber;

at least one substrate being disposed within said chamber in engagement with said substrate holder;

a heat shield being disposed within said chamber between said source and said substrate, said heat shield functioning to prevent heat energy radiating from said source from directly impinging upon said substrate; said heat shield being electrically isolated from said chamber walls, said source, said rod, said substrate holder and said substrate; and wherein a coolant means is engaged to said heat shield to absorb heat energy from said heat shield.

2. An apparatus as described in claim 1 wherein said coolant means includes a liquid coolant system including an inlet coolant tube and an outlet coolant tube, and wherein said heat shield is structurally supported by at least one of said coolant tubes.

3. An apparatus as described in claim 2 wherein said heat shield is formed with a chamber therewithin for the passage of a liquid coolant therethrough for enhanced heat exchange between said heat shield and said liquid coolant.

4. An apparatus as described in claim 1 wherein said coolant means includes a liquid coolant system including an inlet coolant tube and an outlet coolant tube, and wherein said coolant tubes are engaged to said chamber walls utilizing electrically non-conductive mounts.

5. An electric arc vapor deposition apparatus comprising:

a chamber being defined by chamber walls, said chamber being adapted for use in an electric arc vapor deposition process;

a source being mounted within said chamber for providing material to be vaporized and deposited on a substrate;

a source mounting structure being engaged within said chamber for holding said source;

an electrode rod being disposed within said chamber for providing an electric arc between said rod and said source to vaporize portions of said source;

a substrate holder being disposed within said chamber for holding one or more substrates within said chamber;

at least one substrate being disposed within said chamber in engagement with said substrate holder;

a heat shield being disposed within said chamber between said source and said substrate, said heat shield functioning to prevent heat energy radiating from said source from directly impinging upon said substrate;

a coolant means being engaged to said heat shield to absorb heat energy from said heat shield; said coolant means including a liquid coolant system including an inlet coolant tube and an outlet coolant tube, and wherein said heat shield is structurally supported by at least one of said coolant tubes.

* * * * *